United States Patent
Dodds et al.

(10) Patent No.: US 12,308,857 B2
(45) Date of Patent: May 20, 2025

(54) DEVICES, SYSTEMS, AND METHODS FOR ENCODING AND DECODING CODEWORDS

(71) Applicant: Microsoft Technology Licensing, LLC, Redmond, WA (US)

(72) Inventors: Brett K. Dodds, Boise, ID (US); Terry M. Grunzke, Boise, ID (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 18/134,690

(22) Filed: Apr. 14, 2023

(65) Prior Publication Data
US 2024/0348267 A1    Oct. 17, 2024

(51) Int. Cl.
H03M 13/35    (2006.01)
H03M 13/00    (2006.01)
H03M 13/15    (2006.01)

(52) U.S. Cl.
CPC ......... H03M 13/35 (2013.01); H03M 13/353 (2013.01); H03M 13/356 (2013.01); H03M 13/151 (2013.01); H03M 13/611 (2013.01)

(58) Field of Classification Search
CPC ... H03M 13/35; H03M 13/353; H03M 13/356
See application file for complete search history.

(56) References Cited

U.S. PATENT DOCUMENTS

| | | | | |
|---|---|---|---|---|
| 6,363,513 B1 * | 3/2002 | Hekstra | ................. | H04L 1/0014 714/774 |
| 6,370,669 B1 * | 4/2002 | Eroz | ................... | H03M 13/036 714/790 |
| 6,888,818 B1 * | 5/2005 | Gubbi | ...................... | H04L 9/40 370/465 |
| 7,559,004 B1 * | 7/2009 | Chang | .................. | H03M 13/09 714/708 |
| 9,768,808 B2 * | 9/2017 | Sprouse | .................. | G11C 29/52 |
| 10,235,232 B2 * | 3/2019 | Henry | ................. | G06F 9/30014 |
| 2003/0061456 A1 * | 3/2003 | Ofek | ................... | G06F 11/1448 714/E11.121 |
| 2013/0024939 A1 * | 1/2013 | Glew | .................. | H04L 63/1408 726/22 |
| 2015/0229439 A1 * | 8/2015 | Stolpman | ................ | H04L 1/203 714/776 |
| 2015/0318871 A1 * | 11/2015 | Hoekstra | ............... | H03M 13/35 714/763 |
| 2017/0286287 A1 * | 10/2017 | Hady | .................. | G06F 12/0246 |
| 2018/0374548 A1 | 12/2018 | Achtenberg | | |

OTHER PUBLICATIONS

International Search Report and Written Opinion received for PCT Application No. PCT/US2024/022919, Jul. 8, 2024, 12 pages.

* cited by examiner

*Primary Examiner* — Joseph D Torres
(74) *Attorney, Agent, or Firm* — RAY QUINNEY & NEBEKER P.C.; Paul N. Taylor

(57) ABSTRACT

A memory controller may receive memory data to be stored on a memory. A memory controller may receive metadata related to the memory data. The metadata may be selected from a predetermined list of metadata. A memory controller may identify an encoding polynomial of a plurality of polynomials that is associated with the metadata, each polynomial of the plurality of polynomials associated with different metadata from the predetermined list of metadata. A memory controller may generate a codeword using the encoding polynomial of the plurality of polynomials and the memory data.

22 Claims, 11 Drawing Sheets

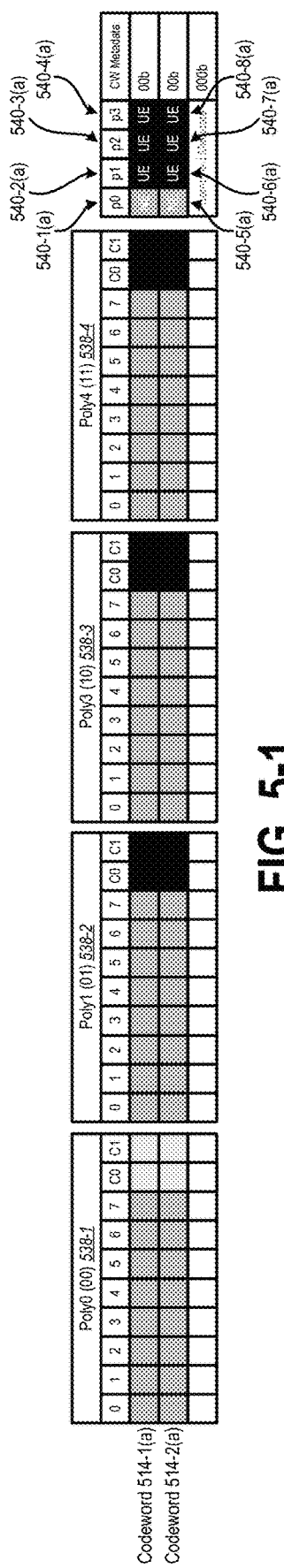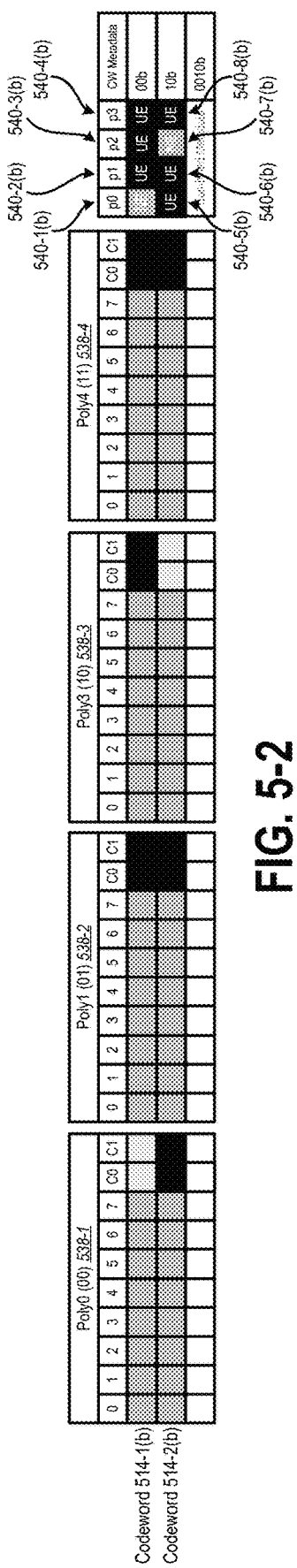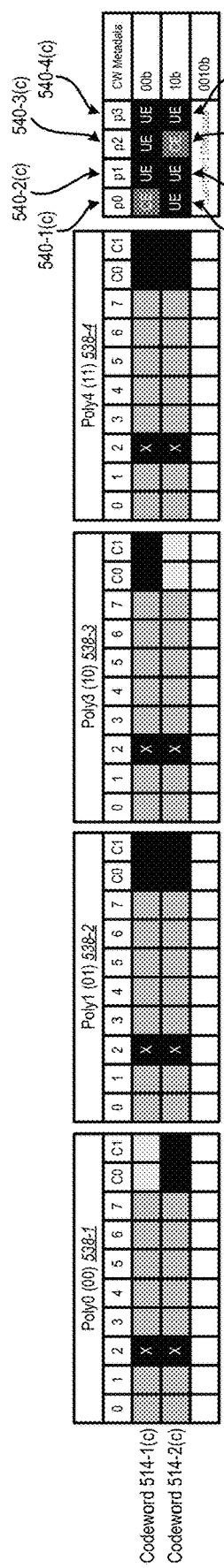
FIG. 5-1
FIG. 5-2
FIG. 5-3

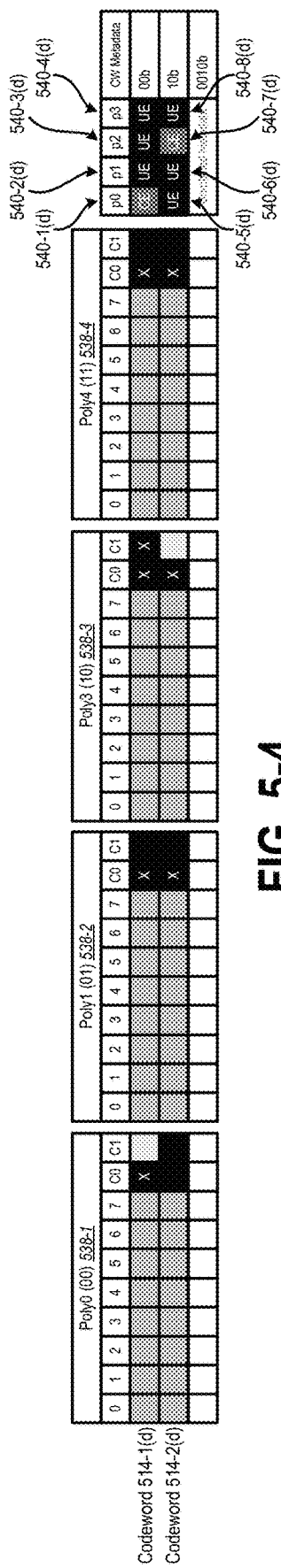
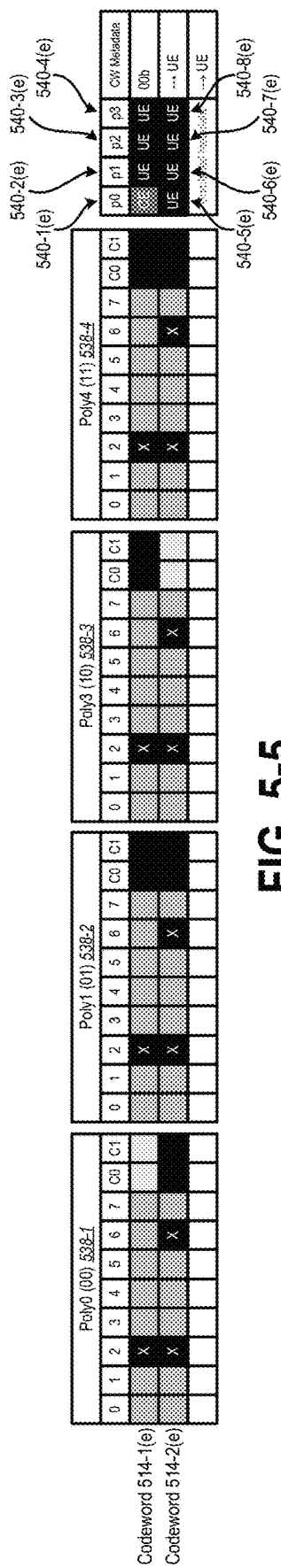
FIG. 5-4
FIG. 5-5

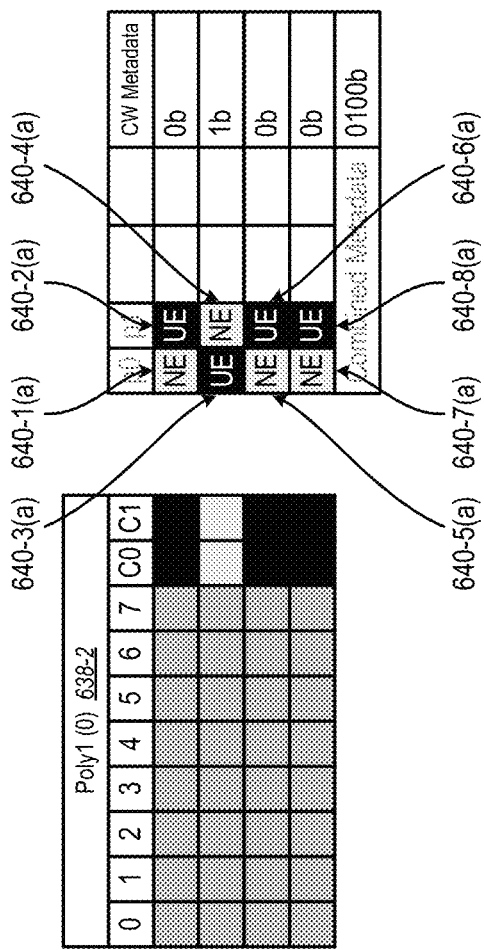
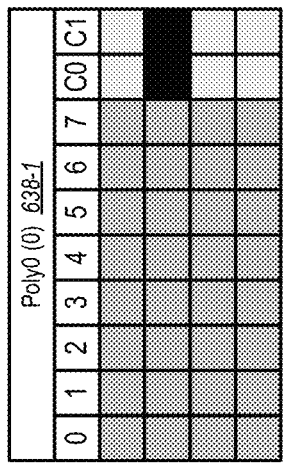
FIG. 6-1
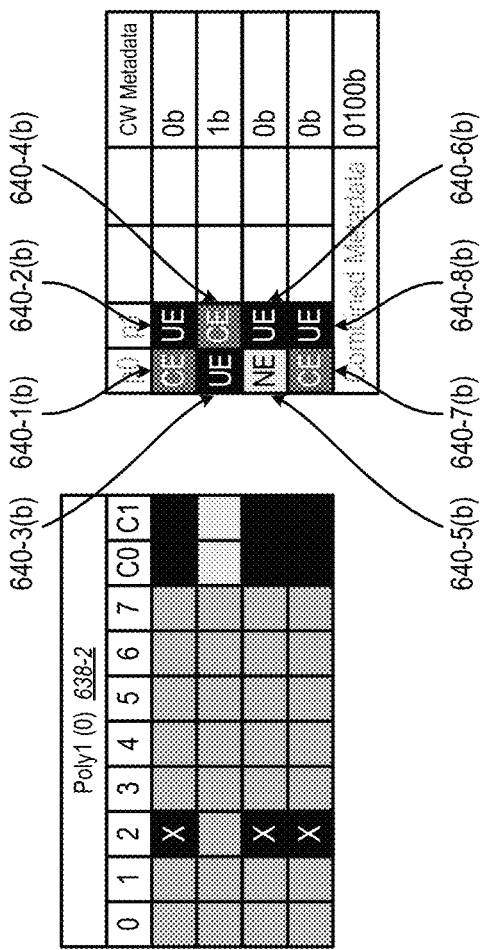
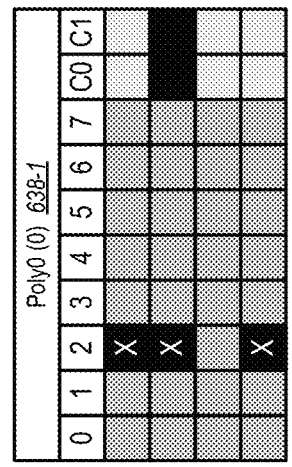
FIG. 6-2

DEVICES, SYSTEMS, AND METHODS FOR ENCODING AND DECODING CODEWORDS

CROSS-REFERENCE TO RELATED APPLICATIONS

N/A.

BACKGROUND

Random Access Memory (RAM) utilizes dies of memory devices to store data. The data stored in the dies may be subject to errors. Error correcting code (ECC) may be included in parity dies to perform error correcting functions and maintain parity of the data.

BRIEF SUMMARY

In some aspects, the techniques described herein relate to a method. A memory controller receives memory data to be stored on a memory. The memory controller receives metadata related to the memory data. The metadata is selected from a predetermined list of metadata. The memory controller identifies an encoding polynomial of a plurality of polynomials that is associated with the metadata. Each polynomial of the plurality of polynomials is associated with different metadata from the predetermined list of metadata. The memory controller generates a codeword using the encoding polynomial of the plurality of polynomials and the memory data.

In some aspects, a memory controller receives a codeword for memory data stored on a memory. The memory controller decodes the codeword using a plurality of polynomials to generate a plurality of decoding results. Each polynomial of the plurality of polynomials is associated with different metadata from a predetermined list of metadata. The memory controller identifies a best decoding result from the plurality of decoding results. The memory controller identifies memory metadata for the memory data from the predetermined list of metadata associated with the memory data based on the best decoding result.

In some aspects, a memory controller receives memory data to be stored on a memory. The memory controller receives metadata related to the memory data. The metadata is selected from a predetermined list of metadata. The memory controller identifies a plurality of encoding polynomials from a plurality of polynomials that is associated with the metadata. Each polynomial of the plurality of polynomials is associated with different metadata sections of a plurality of metadata sections. The plurality of encoding polynomials are associated with a plurality of encoding metadata sections of the plurality of metadata sections. The plurality of encoding metadata sections are combinable to form the metadata. The memory controller generates a plurality of codewords using the plurality of encoding polynomials of the plurality of polynomials and the memory data.

This summary is provided to introduce a selection of concepts that are further described below in the detailed description. This summary is not intended to identify key or essential features of the claimed subject matter, nor is it intended to be used as an aid in limiting the scope of the claimed subject matter. Additional features and advantages of embodiments of the disclosure will be set forth in the description which follows, and in part will be obvious from the description, or may be learned by the practice of such embodiments. The features and advantages of such embodiments may be realized and obtained by means of the instruments and combinations particularly pointed out in the appended claims. These and other features will become more fully apparent from the following description and appended claims, or may be learned by the practice of such embodiments as set forth hereinafter.

BRIEF DESCRIPTION OF THE DRAWINGS

In order to describe the manner in which the above-recited and other features of the disclosure can be obtained, a more particular description will be rendered by reference to specific implementations thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example implementations, the implementations will be described and explained with additional specificity and detail through the use of the accompanying drawings in which:

FIG. 4-1 through FIG. 4-5 are representations of a single-codeword decoding scheme to identify memory metadata associated with the memory data, according to at least one embodiment of the present disclosure;

FIG. 5-1 through FIG. 5-5 are representations of a multi-codeword decoding scheme to identify memory metadata associated with the memory data, according to at least one embodiment of the present disclosure;

FIG. 6-1 through FIG. 6-3 are representations of a multi-codeword decoding scheme to identify memory metadata associated with the memory data, according to at least one embodiment of the present disclosure;

DETAILED DESCRIPTION

Figure 1:
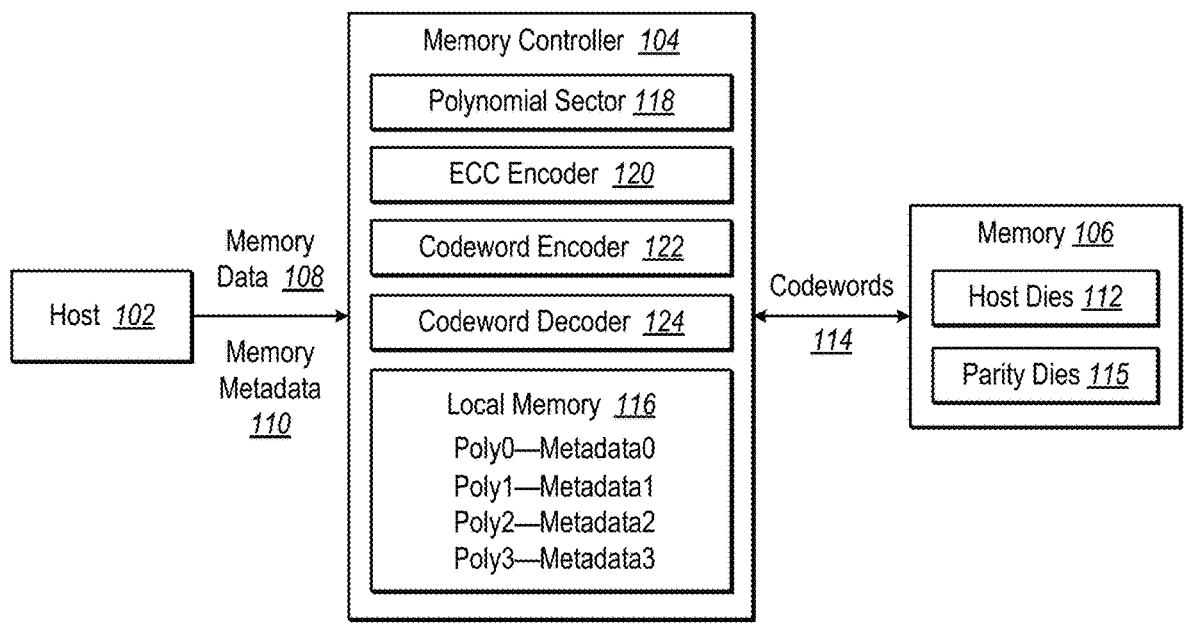
FIG. 1 is a representation of a memory encoding system, according to at least one embodiment of the present disclosure.

This disclosure generally relates to devices, systems, and methods for data storage in memory. Memory, such as a random-access memory (RAM) chip includes one or more host dies that store host data and one or more parity dies that store parity information for error correcting code (ECC). The host dies store information, such as data, code, or other information. The parity dies include the ECC stored as codewords including one or more symbols to help restore data to the host dies in the event of a loss of data. Put another way, if there is a loss of data in one or more of the host dies, the codewords stored in the parity dies may be used to restore the lost data.

In some situations, the information to be stored in the memory may include memory data and metadata. Memory data may include the data that is to be stored on the host dies. The memory data may include the primary data to be stored on the memory. Metadata may be data that is related to the memory data. In some embodiments, the metadata may be descriptive of the memory data. In some embodiments, the metadata may be data that is in excess of a data storage capacity of the memory. Put another way, the metadata may not be able to be stored in the memory.

Conventionally, to store the metadata in the memory, the metadata may occupy one or more data slots in one or more of the parity dies of the memory. But storing metadata in the parity dies may reduce the capacity of the ECC to identify and/or correct errors in the host dies of the memory.

In accordance with at least one embodiment of the present disclosure, metadata may be associated with the memory data without loss of error-correcting capacity of the ECC. For example, the ECC codeword may be encoded using a polynomial vector. Different polynomial vectors may generate different codewords for the same memory data. Different polynomial vectors may be associated with different metadata. A memory system may include a list of predetermined metadata, with different polynomial vectors associated with different metadata from the list of predetermined metadata. When memory data and the associated memory metadata is to be stored on the memory, a memory controller may identify an encoding polynomial vector based on which polynomial vector is associated with the memory metadata from the list of predetermined metadata. The encoding polynomial vector may encode the codeword using the memory data.

In accordance with at least one embodiment of the present disclosure, when accessing the memory data from the memory, the memory controller may decode the memory metadata using a plurality of polynomial vectors. Only one polynomial vector may generate a no-error result (or, as discussed in further detail herein, a correctable error if there is an error in the memory data). The memory metadata may be identified by which polynomial vector generated the no-error result and identifying which metadata from the list of predetermined metadata is associated with that polynomial vector. In this manner, the memory metadata may be associated with the memory data without storing the memory metadata on the memory. This may help to maintain the error-correcting capacity of the ECC while associating metadata with the memory.

FIG. 1 is a representation of a memory encoding system 100, according to at least one embodiment of the present disclosure. The memory encoding system 100 includes a host 102. The host 102 may be any type of host. For example, the host 102 may include a computing system, a sensor, a message receiver, any other host 102, and combinations thereof. The host 102 may transmit information to a memory controller 104 for storage on a memory 106. For example, the host 102 may transmit memory data 108 and memory metadata 110 to the memory controller 104.

The memory controller 104 may receive the memory data 108 and the memory metadata 110 and prepare the memory data 108 for storage on the memory 106. The memory controller 104 may store the memory data 108 on one or more host dies 112 on the memory 106. The memory controller 104 may generate ECC for storage on one or more parity dies 115 and combine the ECC with the memory data 108 in the form of one or more codewords 114. The ECC may be stored in the parity dies and the memory data 108 may be stored in the host dies. The codeword 114 may be transmitted to another computing device and used to retrieve the memory data 108 and/or perform error checking and correction on the memory data 108.

In some embodiments, the ECC may be generated using Reed-Solomon (RS) code. While at least one embodiment of the present disclosure may implement ECC using RS code, it should be understood that any other type of ECC may be utilized, such as Golay, Bose-Chaudhuri-Hocquenghem (BCH), multidimensional parity, Hamming, any other type of ECC, and combinations thereof.

In some embodiments, the memory controller 104 may generate the ECC based on finite field arithmetic. In finite field arithmetic, arithmetic operations are performed on a set of integers modulo a prime number. A polynomial over a finite field is defined as a function that maps elements of the field to other elements of the field. To encode data using RS ECC, the data may first be divided into blocks of a fixed length. Each block may be treated as a coefficient of a polynomial. The polynomial is then evaluated at a set of points in the finite field to generate a set of encoded information, such as the parity data in a memory block. The encoded information may be combined with the original data and stored in the form of a codeword 114.

During decoding of RS ECC, the received codewords are first checked for errors using various error detection techniques. If errors are detected, then the received polynomial may be reconstructed using a set of received codewords and an interpolation algorithm. Once the polynomial is reconstructed, the original data can be obtained by evaluating the polynomial at the same set of points used during encoding.

In accordance with at least one embodiment of the present disclosure, the memory controller 104 may include local memory 116. The local memory 116 may include associations between a plurality of polynomials and a predetermined list of metadata. In some embodiments, each polynomial may be associated with different metadata from the predetermined list of metadata. For example, the local memory 116 shown includes a first association between polynomial 0 (e.g., poly0) and metadata 0, a second association between polynomial 1 (e.g., poly1) and metadata 1, a third association between polynomial 2 (e.g., poly2) and metadata 2, and a fourth association between polynomial 3 (e.g., poly3) and metadata 3.

The host 102 may include the predetermined list of metadata shown in the local memory 116. In some embodiments, the host 102 may include the associations between the polynomials and the predetermined list of metadata shown in the local memory 116, including the associations of the plurality of polynomials that are each associated with different metadata from the predetermined list of metadata. The host 102 may select the memory metadata 110 from the predetermined list of metadata. In this manner, the memory metadata 110 transmitted by the host 102 to the memory controller 104 may be one of the list of predetermined metadata.

In accordance with at least one embodiment of the present disclosure, the metadata may include any type of metadata. For example, the metadata may include one or more of an indicator regarding whether the memory data 108 is stored in multiple different sockets or whether the memory data 108 is directly attached to a socket, for security considerations, poison identification, cache tag bits, any other type of metadata, and combinations thereof.

The memory metadata 110 may have a metadata size. The metadata size may be based on the number of polynomials and/or the number of codewords 114 utilized. For example, an association list of two polynomials and one codeword may result in a metadata size of two bits. In some examples, the metadata size may be any size based on the number of decodably distinct codewords 114 that the memory controller 104 may generate. In some examples, the metadata size may be based on the number of polynomials that may be used to generate the codewords 114. In some examples, the metadata size may include any value, including 2 bits, 4 bits, 8 bits, 16 bits, 32 bits, 64 bits, any other metadata size, and combinations thereof.

When the memory controller 104 receives the memory metadata 110, a polynomial selector 118 may review the memory metadata 110 to select a polynomial to use to generate the ECC and the codewords 114. For example, the polynomial selector 118 may review the predetermined list of metadata for the memory metadata 110. If the memory metadata 110 is located on the predetermined list of metadata, the polynomial selector 118 may determine the associated polynomial. The polynomial selector 118 may select the polynomial associated with the identified metadata from the list of predetermined metadata.

The memory controller 104 may include an ECC encoder 120. The ECC encoder 120 may generate the ECC using the selected polynomial selected by the polynomial selector 118. For example, the ECC encoder 120 may generate the ECC using RS ECC and the selected polynomial. In some embodiments, the memory controller 104 may save the memory data 108 and the ECC to the host dies 112 and the parity dies 115 on the memory 106, respectively.

In some embodiments, the memory controller 104 may include a codeword encoder 122. The codeword encoder 122 may encode the generated ECC and the memory data 108 into one or more codewords 114. In some embodiments, the codewords 114 may be stored on the memory 106 and/or transmitted to another computing device.

In accordance with at least one embodiment of the present disclosure, the memory metadata 110 is not stored on the memory 106 (e.g., not stored on the host dies 112, not stored on the parity dies 115). In some embodiments, the memory metadata 110 is not encoded into the codewords 114. As discussed herein, not storing the memory metadata 110 in the memory 106 and/or not encoding the memory metadata 110 into the codewords 114 may help to improve the error correcting capacity of the ECC and/or not take up space in the memory 106 used or reserved for the memory data 108.

The memory controller 104 may include a codeword decoder 124. When the memory data 108 stored in the memory 106 is to be accessed, the codeword decoder 124 may decode the codewords 114. For example, the codeword decoder 124 may apply a plurality of polynomials to the codewords 114 during the decoding process. Decoding using the plurality of polynomials may result in a plurality of decoding results (e.g., one decoding result for each polynomial used to decode).

Because the memory metadata 110 is not stored in the memory 106 or encoded into the codewords 114, The memory controller 104 may not know the association between the memory data 108 and the memory metadata 110. To determine the memory metadata 110, the codeword decoder 124 may analyze the decoding results to determine whether the ECC has any errors. The decoding results that provide a result of no error may indicate which polynomial (e.g., a decoding polynomial) was used to encode the codewords 114.

The codeword decoder 124 may compare the decoding polynomial to the list of polynomials associated with the different metadata from the predetermined list of metadata in the local memory 116. The codeword decoder 124 may identify the decoding polynomial on the list of polynomials and determine that the memory metadata 110 is the metadata from the predetermined list of metadata associated with the identified decoding polynomial. In this manner, the memory metadata 110 may be associated with the memory data 108 without storing the memory metadata 110 in the memory 106 and/or encoding the memory metadata 110 in the codewords 114.

In some embodiments, the codeword decoder 124 may decode the codewords 114 using each of the polynomials of the plurality of polynomials in the associated list stored in the local memory 116. In this manner, the codeword decoder 124 may determine which of the metadata from the predetermined list of metadata is the memory metadata 110. In some embodiments, the polynomials may produce decodably distinct codewords 114. During decoding, when the polynomials produce the decoding results, the decoding results may be sufficiently distinct that a false positive decoding result of no error is not generated. Generating a false positive decoding result may reduce the certainty of which metadata from the predetermined list of metadata corresponds to the memory metadata 110.

In some embodiments, when the codeword decoder 124 decodes the codewords 114, there may be a data error present in the memory data 108 and/or the ECC. In this case, the codeword decoder 124 may not produce any decoding results indicating no error. In the case of error in the data, one of the decoding results may return correctable error and the other decoding results may return uncorrectable error. The decoding result indicating correctable error may be identified as associated with the decoding polynomial, and the metadata associated with the decoding polynomial may be determined to be the memory metadata 110. In some situations, all of the decoding results may indicate uncorrectable error. In this situation, the data may be unrecoverable.

Figure 2:
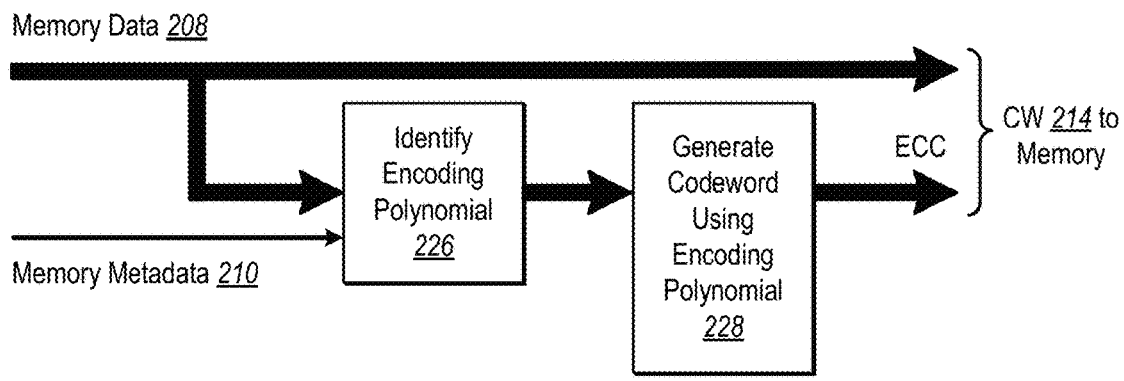
FIG. 2 is a flowchart showing a series of acts for encoding a codeword for use in memory storage, according to at least one embodiment of the present disclosure.

FIG. 2 is a flowchart showing a series of acts for encoding a codeword for use in memory storage, according to at least one embodiment of the present disclosure. A memory controller (e.g., the memory controller 104 of FIG. 1) may receive memory data 208 and memory metadata 210. As may be seen, the memory controller may receive the memory metadata 210, and, using the memory metadata 210, identify the encoding polynomial at 226. For example, as discussed above with respect to FIG. 1, the memory controller may identify the encoding polynomial by comparing the memory metadata 210 to a predetermined list of metadata. The encoding polynomial may be associated with the memory metadata 210 in the predetermined list of metadata.

When the memory controller selects the encoding polynomial, the memory controller may generate ECC using encoding polynomial at 228. The ECC and the memory data 208 may be combined to generate a codeword 214 that may be transmitted to the memory. As discussed herein, the memory metadata 210 may not be stored in the memory, stored in the ECC, or encoded into the codeword. In this manner, the memory metadata 210 may be associated with the memory data 208 without reducing the ECC capacity of the ECC and/or taking a memory slot of the memory used by or reserved for the memory data 208.

Figure 3:
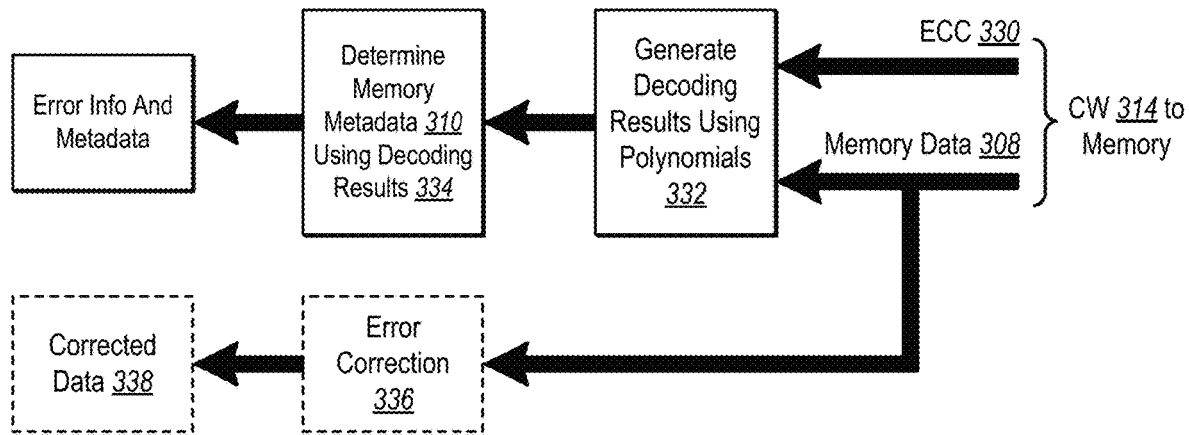
FIG. 3 is a flowchart showing a series of acts for decoding a codeword for use in memory storage, according to at least one embodiment of the present disclosure.

FIG. 3 is a flowchart showing a series of acts for decoding a codeword for use in memory storage, according to at least one embodiment of the present disclosure. A memory controller (e.g., the memory controller 104 of FIG. 1) may encode a codeword 314 from a memory. The memory controller may decode the codeword 314 into ECC 330 and memory data 308. To decode the codeword 314, the memory controller may generate a plurality of decoding results using a plurality of polynomials to decode the codeword 314 at 332.

Using the decoding results, the memory controller may determine memory metadata 310 associated with the memory data 308 at 334. For example, the memory controller may compare the decoding results to determine which decoding result has the best decoding result. In some embodiments, the best decoding result may be the decoding result that indicates no error when the other decoding results indicate correctable error or uncorrectable error. In some embodiments, the best decoding result may be the decoding result that indicates correctable error when the other decoding results indicates uncorrectable error.

The memory controller may determine which of the polynomials generated the best decoding result, which may be the encoding polynomial. The memory controller may then identify which of the metadata from the predetermined list of metadata is associated with the encoding polynomial. This may be the memory metadata 310. The memory controller may then output the ECC 330 and the memory metadata 310.

In some embodiments, the memory controller may perform error correction using the ECC 330 at 336. For example, the memory data 308 may have one or more errors, and the memory controller may perform error correction using the ECC 330 to output corrected data 338. As discussed herein, the memory and/or the codeword may not include the memory metadata 310. This may improve the error-capacity of the ECC 330. For example, this may allow the ECC to provide chip-kill functionality, which may be the ability to correct any single-device fault. Put another way, the ECC may provide chip-kill functionality while associating metadata with the memory data 308.

Figures 1, 4:
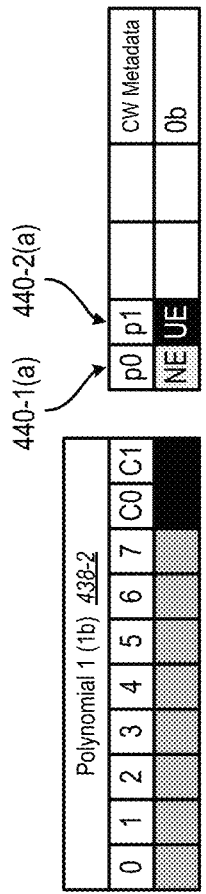
Figures 2, 4:
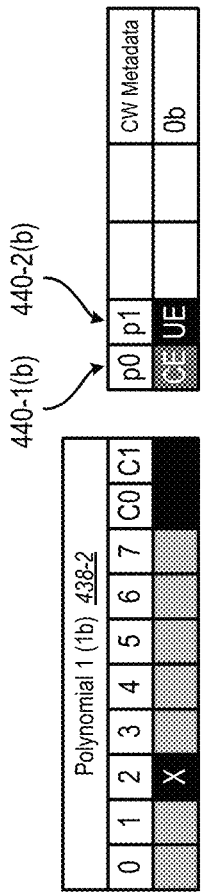
Figures 3, 4:
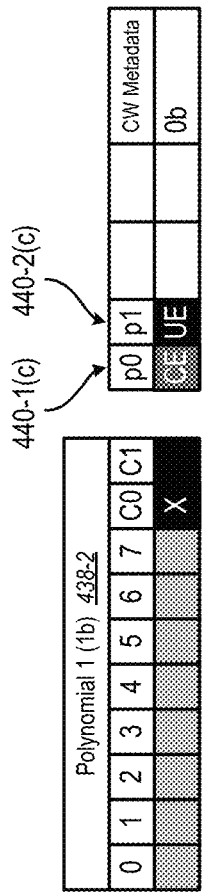
Figure 4:
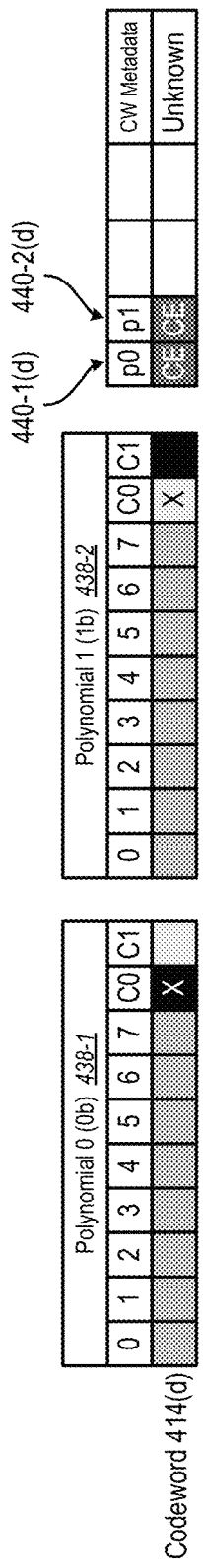
Figures 4, 5:
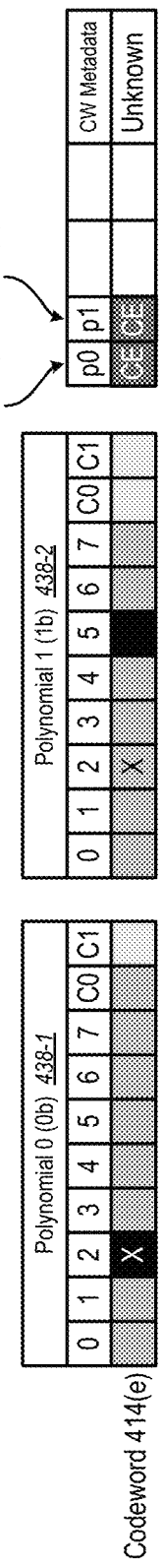

FIG. 4-1 through FIG. 4-5 are representations of a single-codeword decoding scheme to identify memory metadata associated with the memory data, according to at least one embodiment of the present disclosure. A codeword 414 may be decoded using a first polynomial 438-1 (e.g., polynomial 0) and a second polynomial 438-2 (polynomial 1). The first polynomial 438-1 may be associated with metadata value 0 and the second polynomial 438-2 may be associated with metadata value 1. Put another way, the predetermined list of metadata may include values 0 and 1, and the plurality of polynomials may include the first polynomial 438-1 (associated with metadata value 0) and the second polynomial 438-2 (associated with metadata value 1). In each of the embodiments shown, the codeword 414 has been decoded by both the first polynomial 438-1 to generate a first decoding result (collectively 440-1) and the second polynomial 438-2 to generate a second decoding result (collectively 440-2).

In FIG. 4-1, the first decoding result 440-1(a) is a no error result. For example, the first polynomial 438-1 decoded the codeword 414(a) resulting in ECC that indicates that there is no error in the memory data. The second decoding result 440-2(a) is an uncorrectable error result. For example, the second polynomial 438-2 decoded the codeword 414(a) resulting in ECC that indicates that there is an uncorrectable error in the memory data. This means that the first decoding result 440-1(a) is the best result. The best result (e.g., the no error result) of the first decoding result 440-1(a) indicates that the first polynomial 438-1 was the polynomial used to encode the codeword 414(a). Because the metadata value 0 is associated with the first polynomial 438-1, the best result indicates that the memory metadata has a value of 0.

As may be seen, the polynomials generates the ECC stored in the C0 and C1 portions of the memory. The first polynomial 438-1 shows that the C0 and C1 provide valid ECC indicating no error at the ECC and the second polynomial 438-2 shows that the C0 and C1 provide ECC that cannot validate or correct any error in the memory stored in the memory data.

In FIG. 4-2, the memory data from the codeword 414(b) includes an error in memory slot 2 of the memory data. This means that the data (e.g., an entirety of the data and/or a portion of the data) stored in slot 2 was corrupted and/or lost during storage and/or transmission. When the first polynomial 438-1 and the second polynomial 438-2 decode the codeword 414(b), the first polynomial 438-1 generates a first decoding result 440-1(b) having a value indicating correctable error in the memory data. The second polynomial 438-2 may generate a second decoding result 440-2(b) having a value indicating uncorrectable error in the memory data. Neither the first decoding result 440-1(b) nor the second decoding result 440-2(b) provide a result of no error. The best result is the correctable error result in the first decoding result 440-1(b). This indicates that the metadata associated with the memory data has a value of 0 (e.g., the metadata value associated with the first polynomial 438-1 that generated the first decoding result 440-1(b)). The ECC resulting from decoding the codeword 414(b) may then be used to perform error correction on the memory data and restore the value in memory slot 2.

In FIG. 4-3, the data from the codeword 414(c) includes an error in the parity slot C0 (e.g., an error in the ECC stored in slot C0). This means that the data (e.g., an entirety of the data and/or a portion of the data) stored in the parity slot c0 was corrupted and/or lost during storage and/or transmission. When the first polynomial 438-1 and the second polynomial 438-2 decode the codeword 414(c), the first polynomial 438-1 generates a first decoding result 440-1(c) having a value indicating correctable error in the data. The second polynomial 438-2 may generate a second decoding result 440-2(c) having a value indicating uncorrectable error in the data. Neither the first decoding result 440-1(c) nor the second decoding result 440-2(c) provide a result of no error. The best result is the correctable error result in the first decoding result 440-1(c). This indicates that the metadata associated with the memory data has a value of 0 (e.g., the metadata value associated with the first polynomial 438-1 that generated the first decoding result 440-1(c)). The ECC stored in the parity slot C1 resulting from decoding the codeword 414(b) may then be used to perform error correction on the parity data and restore the value in parity slot C1.

In FIG. 4-4, the memory data from the codeword 414(d) includes an error in the ECC stored in parity slots C0 and C1. This means that the data (e.g., an entirety of the data and/or a portion of the data) stored in the parity slots C0 and C1 was corrupted and/or lost during storage and/or transmission. For example, based on the decoding by the first polynomial 438-1 and the second polynomial 438-2, a portion of the data in parity slot C0 may be corrupted and/or lost (as indicated by the X symbol) and an entirety of the data in the parity slot C1 may be corrupted and/or lost (as indicated by the shaded portion under the second polynomial 438-2). When the first polynomial 438-1 and the second polynomial 438-2 decode the codeword 414(d), the first polynomial 438-1 generates a first decoding result 440-1(d) having a value indicating correctable error in the memory data. The second polynomial 438-2 may generate a second decoding result 440-2(d) having a value indicating correctable error in the memory data. Neither the first decoding result 440-1(b) nor the second decoding result 440-2(b) provide a result of no error. There is no best result because both polynomials provide the same correctable error result. This indicates that the metadata associated with the memory data is unknown.

In FIG. 4-5, the memory data from the codeword 414(e) includes an error in the ECC stored in memory slots 2 and/or 5. For example, based on the decoding by the first polynomial 438-1, the data in memory slot 2 (e.g., the block, or a portion of the block) is corrupted. Based on the decoding by the second polynomial 438-2, a portion of the data in memory slots 2 (e.g., a portion of the memory, indicated by the symbol X) and 5 (e.g., the entire block, indicated by the shaded block) may be corrupted and/or lost. When the first polynomial 438-1 and the second polynomial 438-2 decode the codeword 414(e), the first polynomial 438-1 generates a first decoding result 440-1(e) having a value indicating correctable error in the memory data. The second polynomial 438-2 may generate a second decoding result 440-2(e) having a value indicating correctable error in the memory data. Neither the first decoding result 440-1(e) nor the second decoding result 440-2(e) provide a result of no error. There is no best result because both polynomials provide the same correctable error result. This indicates that the metadata associated with the memory data is unknown.

FIG. 5-1 through FIG. 5-5 are representations of a multi-codeword decoding scheme, having two codewords and four polynomials, to identify memory metadata associated with the memory data, according to at least one embodiment of the present disclosure. A plurality of codewords (collectively 514) may be decoded using a plurality of polynomials, including first polynomial 538-1 (e.g., poly0), a second polynomial 538-2 (poly1), a third polynomial 538-3 (e.g., poly2), and a fourth polynomial 538-4 (e.g., poly3). The first polynomial 538-1 may be associated with metadata value 00, the second polynomial 538-2 may be associated with metadata value 01, the third polynomial 538-3 may be associated with metadata value 10, and the fourth polynomial 538-4 may be associated with metadata value 11. Put another way, the predetermined list of metadata may include values 00, 01, 10, and 11, and the plurality of polynomials may include the first polynomial 538-1 (associated with metadata value 00), the second polynomial 538-2 (associated with metadata value 01), the third polynomial 538-3 (associated with metadata value 10), and the fourth polynomial 538-4 (associated with metadata value 11). In the embodiments shown, the memory includes a first codeword 514-1 and a second codeword 514-2. Both of the codewords 514-1 and 514-2 have been decoded by each of the first polynomial 538-1 to generate a first decoding result (collectively 540-1) and a fifth decoding result (collectively 540-5), the second polynomial 538-2 to generate a second decoding result (collectively 540-2) and a sixth decoding result (collectively 540-6), the third polynomial 538-3 to generate a third decoding result (collectively 540-3) and a seventh decoding result (collectively 540-7), and the fourth polynomial fourth polynomial 538-4 to generate a fourth decoding result (collectively 540-4) and an eighth decoding result (collectively 540-8).

In FIG. 5-1, the first codeword 514-1(a) is decoded by the first polynomial 538-1 to generate the first decoding result 540-1(a), the second polynomial 538-2 to generate the second decoding result 540-2(a), the third polynomial 538-3 to generate the third decoding result 540-3(a), and the fourth polynomial 538-4 to generate the fourth decoding result 540-4(a). As may be seen, for the first codeword 514-1(a), the best decoding result is the first decoding result 540-1(a), which has a value of no error. This indicates a metadata value for the first codeword 514-1(a) of 00.

The second codeword 514-2(a) is decoded by the first polynomial 538-1 to generate the fifth decoding result 540-5(a), the second polynomial 538-2 to generate the sixth decoding result 540-6(a), the third polynomial 538-3 to generate the seventh decoding result 540-7(a), and the fourth polynomial 538-4 to generate the eighth decoding result 540-8(a). For the second codeword 514-2(a), the best decoding result is the fifth decoding result 540-5(a), which has a value of no error. This indicates a metadata value for the second codeword 514-2(a) of 00.

In some embodiments, the metadata values associated with the plurality of polynomials may be representative of metadata sections. For example, the memory system shown may have a plurality of metadata sections. Each of the metadata sections may be representative of a portion of a memory metadata value. For example, each of the metadata sections may be representative of a digit and/or multiple digits of a memory metadata value. By combining the metadata sections (e.g., by placing the metadata sections in the appropriate digits), the memory metadata value may be determined. In some embodiments, the plurality of polynomials may be associated with different metadata sections of the plurality of metadata sections. For example, each polynomial may be associated with a different metadata section from the plurality of different metadata sections. In this manner, the different encoding polynomials may be used to determine different metadata sections to form the distinct metadata for the memory. The different metadata sections may be combined to form the memory metadata. For example, the different metadata sections may be associated with a particular digit or other placement of information in the memory metadata. By using different metadata sections, longer memory metadata may be associated with the memory data.

In some embodiments, the codewords 514 are identified in a codeword order. The codeword order may be an order in which the decoding results are to be interpreted. For example, in the embodiments shown in FIG. 5-1 through FIG. 5-1, the codeword order may be first the first codeword 514-1 and second the second codeword 514-2. This may indicate that the encoding metadata section value associated with the first codeword 514-1 may occupy the first digit or digits of the memory metadata value and the encoding metadata section value associated with the second codeword 514-2 may occupy the second digit or digits of the memory metadata value. The plurality of encoding metadata section values may then be combinable to form the memory metadata value.

In the embodiment shown in FIG. 5-1, the encoding metadata section value for the first codeword 514-1(a) is the first decoding result 540-1(a), which is 00. The encoding metadata section value for the second codeword 514-2(a) is the fifth decoding result 540-5(a), which is 00. The encoding metadata section value from the first decoding result 540-1(a) occupies the first two digits of the memory metadata value and the encoding metadata section value from the fifth decoding result 540-5(a) occupies the third and fourth digits of the memory metadata value, resulting in a memory metadata value of 0000. In accordance with at least one embodiment of the present disclosure, by selecting the encoding polynomials used to encode the first codeword 514-1 and the second codeword 514-2, multiple different memory metadata values may be determined. In the embodiment shown, sixteen possible memory metadata values are possible.

For example, in the embodiment shown in FIG. 5-2, the first codeword 514-1(b) is decoded by the first polynomial 538-1 to generate the first decoding result 540-1(b), the second polynomial 538-2 to generate the second decoding result 540-2(b), the third polynomial 538-3 to generate the third decoding result 540-3(b), and the fourth polynomial 538-4 to generate the fourth decoding result 540-4(b). As may be seen, for the first codeword 514-1(b), the best decoding result is the first decoding result 540-1(b), which has a value of no error. This indicates a metadata value for the first codeword 514-1(b) of 00.

The second codeword 514-2(b) is decoded by the first polynomial 538-1 to generate the fifth decoding result 540-5(b), the second polynomial 538-2 to generate the sixth decoding result 540-6(b), the third polynomial 538-3 to generate the seventh decoding result 540-7(b), and the fourth polynomial 538-4 to generate the eighth decoding result 540-8(b). For the second codeword 514-2(b), the best decoding result is the seventh decoding result 540-7(b), which has a value of no error. This indicates a metadata value for the second codeword 514-2(b) of 10.

In this manner, the encoding metadata section value for the first codeword 514-1(b) is the first decoding result 540-1(b), which is 00. The encoding metadata section value for the second codeword 514-2(b) is the seventh decoding result 540-7(b), which is 10. The encoding metadata section value from the first decoding result 540-1(b) occupies the first two digits of the memory metadata value and the encoding metadata section value from the seventh decoding result 540-7(b) occupies the third and fourth digits of the memory metadata value, resulting in a memory metadata value of 0010.

In the embodiment shown in FIG. 5-3, the first codeword 514-1(c) is decoded by the first polynomial 538-1 to generate the first decoding result 540-1(c), the second polynomial 538-2 to generate the second decoding result 540-2(c), the third polynomial 538-3 to generate the third decoding result 540-3(c), and the fourth polynomial 538-4 to generate the fourth decoding result 540-4(c). As may be seen, for the first codeword 514-1(c), the best decoding result is the first decoding result 540-1(c), which has a value of correctable error while the remaining decoding results have values of uncorrectable error. This indicates a metadata value for the first codeword 514-1(c) of 00.

The second codeword 514-2(c) is decoded by the first polynomial 538-1 to generate the fifth decoding result 540-5(c), the second polynomial 538-2 to generate the sixth decoding result 540-6(c), the third polynomial 538-3 to generate the seventh decoding result 540-7(c), and the fourth polynomial 538-4 to generate the eighth decoding result 540-8(c). For the second codeword 514-2(c), the best decoding result is the seventh decoding result 540-7(c), which has a value of correctable error while the remaining decoding results have values of uncorrectable error. This indicates a metadata value for the second codeword 514-2(c) of 10. The error in the memory data indicated by the ECC in both of the codewords 514 may be located in memory slot 2. In this manner, as may be seen, the memory system maintains chip-kill functionality while providing metadata for the memory data.

In this manner, and using the best decoding results, the encoding metadata section value for the first codeword 514-1(c) is the first decoding result 540-1(c), which is 00. The encoding metadata section value for the second codeword 514-2(c) is the seventh decoding result 540-7(c), which is 10. The encoding metadata section value from the first decoding result 540-1(c) occupies the first two digits of the memory metadata value and the encoding metadata section value from the seventh decoding result 540-7(c) occupies the third and fourth digits of the memory metadata value, resulting in a memory metadata value of 0010.

In the embodiment shown in FIG. 5-4, the first codeword 514-1(d) is decoded by the first polynomial 538-1 to generate the first decoding result 540-1(d), the second polynomial 538-2 to generate the second decoding result 540-2(d), the third polynomial 538-3 to generate the third decoding result 540-3(d), and the fourth polynomial 538-4 to generate the fourth decoding result 540-4(d). As may be seen, for the first codeword 514-1(d), the best decoding result is the first decoding result 540-1(d), which has a value of correctable error while the remaining decoding results have values of uncorrectable error. This indicates a metadata value for the first codeword 514-1(d) of 00.

The second codeword 514-2(d) is decoded by the first polynomial 538-1 to generate the fifth decoding result 540-5(d), the second polynomial 538-2 to generate the sixth decoding result 540-6(d), the third polynomial 538-3 to generate the seventh decoding result 540-7(d), and the fourth polynomial 538-4 to generate the eighth decoding result 540-8(d). For the second codeword 514-2(d), the best decoding result is the seventh decoding result 540-7(d), which has a value of correctable error while the remaining decoding results have values of uncorrectable error. This indicates a metadata value for the second codeword 514-2(d) of 10. The error in the memory data indicated by the ECC in both of the codewords 514 may be located in the ECC located in parity slot C0. As may be seen, the memory system maintains chip-kill functionality while providing metadata for the memory data.

In this manner, the encoding metadata section value for the first codeword 514-1(d) is the first decoding result 540-1(d), which is 00. The encoding metadata section value for the second codeword 514-2(d) is the seventh decoding result 540-7(d), which is 10. The encoding metadata section value from the first decoding result 540-1(d) occupies the first two digits of the memory metadata value and the encoding metadata section value from the seventh decoding result 540-7(d) occupies the third and fourth digits of the memory metadata value, resulting in a memory metadata value of 0010.

In the embodiment shown in FIG. 5-5, the first codeword 514-1(e) is decoded by the first polynomial 538-1 to generate the first decoding result 540-1(e), the second polynomial 538-2 to generate the second decoding result 540-2(e), the third polynomial 538-3 to generate the third decoding result 540-3(e), and the fourth polynomial 538-4 to generate the fourth decoding result 540-4(e). As may be seen, for the first codeword 514-1(e), the best decoding result is the first decoding result 540-1(e), which has a value of correctable error while the remaining decoding results have values of uncorrectable error. This indicates a metadata value for the first codeword 514-1(e) of 00.

The second codeword 514-2(e) is decoded by the first polynomial 538-1 to generate the fifth decoding result 540-5(e), the second polynomial 538-2 to generate the sixth decoding result 540-6(e), the third polynomial 538-3 to generate the seventh decoding result 540-7(e), and the fourth polynomial 538-4 to generate the eighth decoding result 540-8(e). For the second codeword 514-2(e), there is no best decoding result because all of the decoding results have values of uncorrectable error. This indicates that the metadata value for the second codeword 514-2(*e*) is unknowable. This may be caused, for example, by an uncorrectable error in the second codeword 514-2(*e*). Because the metadata value for the second codeword 514-2(*e*) is unknowable, the memory metadata value may be unknowable. However, because two codewords were generated for the memory data, the error in the memory data may still be corrected using the ECC for the first codeword 514-1(*e*).

Figures 3, 6:
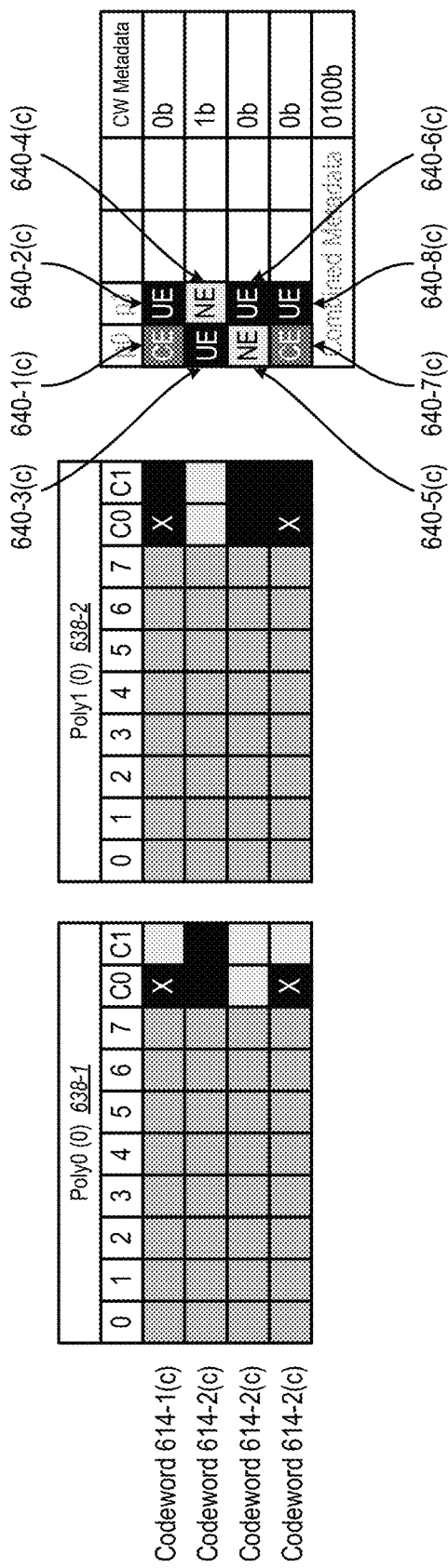

FIG. 6-1 through FIG. 6-3 are representations of a multi-codeword decoding scheme, having four codewords and two polynomials, to identify memory metadata associated with the memory data, according to at least one embodiment of the present disclosure. A plurality of codewords (collectively 614) may be decoded using a plurality of polynomials (collectively 638), including first polynomial 638-1 (e.g., poly0) and a second polynomial 638-2 (poly1). The first polynomial 638-1 may be associated with metadata value 0 and the second polynomial 638-2 may be associated with metadata value 1. Put another way, the predetermined list of metadata may include values 0 and 1 and the plurality of polynomials may include the first polynomial 638-1 (associated with metadata value 0) and the second polynomial 638-2 (associated with metadata value 1). In the embodiments shown, the memory includes a first codeword 614-1, a second codeword 614-2, a third codeword 614-3, and a fourth codeword 614-4. Each of the codewords 614-1, 614-2, 614-3, and 614-4 have been decoded by both the first polynomial 638-1 to generate a first decoding result (collectively 640-1), a third decoding result (collectively 640-3), a fifth decoding result (collectively 640-5), and a seventh decoding result (collectively 640-7). Each of the codewords 614-1, 614-2, 614-3, and 614-4 have also been decoded by both the second polynomial 638-2 to generate a second decoding result (collectively 640-2), a fourth decoding result (collectively 640-4), a sixth decoding result (collectively 640-6), and an eighth decoding result (collectively 640-8).

In FIG. 6-1, the first polynomial 638-1 decodes the first codeword 614-1(*a*) to generate the first decoding result 640-1(*a*), the second codeword 614-2(*a*) to generate the third decoding result 640-2(*a*), the third codeword 614-3(*a*) to generate the fifth decoding result 640-5(*a*), and the fourth codeword 614-4(*a*) to generate the seventh decoding result 640-7(*a*).

The second polynomial 638-2 decodes the first codeword 614-1(*a*) to generate the second decoding result 640-2(*a*), the second codeword 614-2(*a*) to generate the fourth decoding result 640-4(*a*), the third codeword 614-3(*a*) to generate the sixth decoding result 640-6(*a*), and the fourth codeword 614-4(*a*) to generate the eighth decoding result 640-8(*a*).

As may be seen, the first codeword 614-1(*a*) has a best decoding result of the first decoding result 640-1(*a*), having a decoding result of no error and an associated first encoding metadata section value of 0, the second codeword 614-2(*a*) has a best decoding result of the fourth decoding result 640-4(*a*) having a decoding result of no error and an associated second encoding metadata section value of 1, the third codeword 614-3(*a*) has a best decoding result of the fifth decoding result 640-5(*a*) having a decoding result of no error and an associated third encoding metadata section of value 0, and the fourth codeword 614-4(*a*) has a best decoding result of the seventh decoding result 640-7(*a*) having a decoding result of no error and an associated fourth encoding metadata section value of 0.

The codewords 614 have a codeword order, which may be representative of the order of digits in the memory metadata. In some embodiments, the codeword order may include first the first codeword 614-1(*a*) representing in the first digit of the memory metadata, second the second codeword 614-2(*a*) representing the second digit of the memory metadata, third the third codeword 614-3(*a*) representing the third digit of the memory metadata, and fourth the fourth codeword 614-4(*a*) representing the fourth digit of the memory metadata. Combining the metadata sections using the codeword order results in a memory metadata value of 0100.

In FIG. 6-2, the first polynomial 638-1 decodes the first codeword 614-1(*b*) to generate the first decoding result 640-1(*b*), the second codeword 614-2(*b*) to generate the third decoding result 640-2(*b*), the third codeword 614-3(*b*) to generate the fifth decoding result 640-5(*b*), and the fourth codeword 614-4(*b*) to generate the seventh decoding result 640-7(*b*).

The second polynomial 638-2 decodes the first codeword 614-1(*b*) to generate the second decoding result 640-2(*b*), the second codeword 614-2(*b*) to generate the fourth decoding result 640-4(*b*), the third codeword 614-3(*b*) to generate the sixth decoding result 640-6(*b*), and the fourth codeword 614-4(*b*) to generate the eighth decoding result 640-8(*b*).

As may be seen, the first codeword 614-1(*b*) has a best decoding result of the first decoding result 640-1(*b*), having a decoding result of correctable error with the other decoding result being uncorrectable error and an associated first encoding metadata section value of 0, the second codeword 614-2(*b*) has a best decoding result of the fourth decoding result 640-4(*b*) having a decoding result of correctable error with the other decoding result being uncorrectable error and an associated second encoding metadata section value of 1, the third codeword 614-3(*b*) has a best decoding result of the fifth decoding result 640-5(*b*) having a decoding result of no error and an associated third encoding metadata section value of 0, and the fourth codeword 614-4(*b*) has a best decoding result of the seventh decoding result 640-7(*b*) having a decoding result of correctable error with the other decoding result being uncorrectable error and an associated fourth encoding metadata section value of 0. The encoding metadata sections may be combined to form a memory metadata value of 0100. In the embodiment shown, the correctable error in the first codeword 614-1(*a*), the second codeword 614-2(*a*), and the fourth codeword 614-4(*a*) is located in the second memory slot. In this manner, the memory system may maintain chip-kill functionality while associating metadata with the memory data.

In FIG. 6-3, the first polynomial 638-1 decodes the first codeword 614-1(*c*) to generate the first decoding result 640-1(*c*), the second codeword 614-2(*c*) to generate the third decoding result 640-2(*c*), the third codeword 614-3(*c*) to generate the fifth decoding result 640-5(*c*), and the fourth codeword 614-4(*c*) to generate the seventh decoding result 640-7(*c*).

The second polynomial 638-2 decodes the first codeword 614-1(*c*) to generate the second decoding result 640-2(*c*), the second codeword 614-2(*c*) to generate the fourth decoding result 640-4(*c*), the third codeword 614-3(*c*) to generate the sixth decoding result 640-6(*c*), and the fourth codeword 614-4(*c*) to generate the eighth decoding result 640-8(*c*).

As may be seen, the first codeword 614-1(*c*) has a best decoding result of the first decoding result 640-1(*c*), having a decoding result of correctable error with the other decoding result being uncorrectable error and an associated first encoding metadata section value of 0, the second codeword 614-2(*c*) has a best decoding result of the fourth decoding result 640-4(*c*) having a decoding result of no error and an associated second encoding metadata section value of 1, the third codeword 614-3(*c*) has a best decoding result of the fifth decoding result 640-5(*c*) having a decoding result of no error and an associated third encoding metadata section value of 0, and the fourth codeword 614-4(*c*) has a best decoding result of the seventh decoding result 640-7(*c*) having a decoding result of correctable error with the other decoding result being uncorrectable error and an associated fourth encoding metadata section value of 0. The encoding metadata sections may be combined to form a memory metadata value of 0100. In the embodiment shown, the correctable error in the first codeword 614-1(*a*) and the fourth codeword 614-4(*a*) is located in the parity slot c0. The ECC in the parity slot C1 may be used to correct the error in the parity slot c0. In this manner, the memory system may maintain chip-kill functionality while associating metadata with the memory data.

Figure 7:
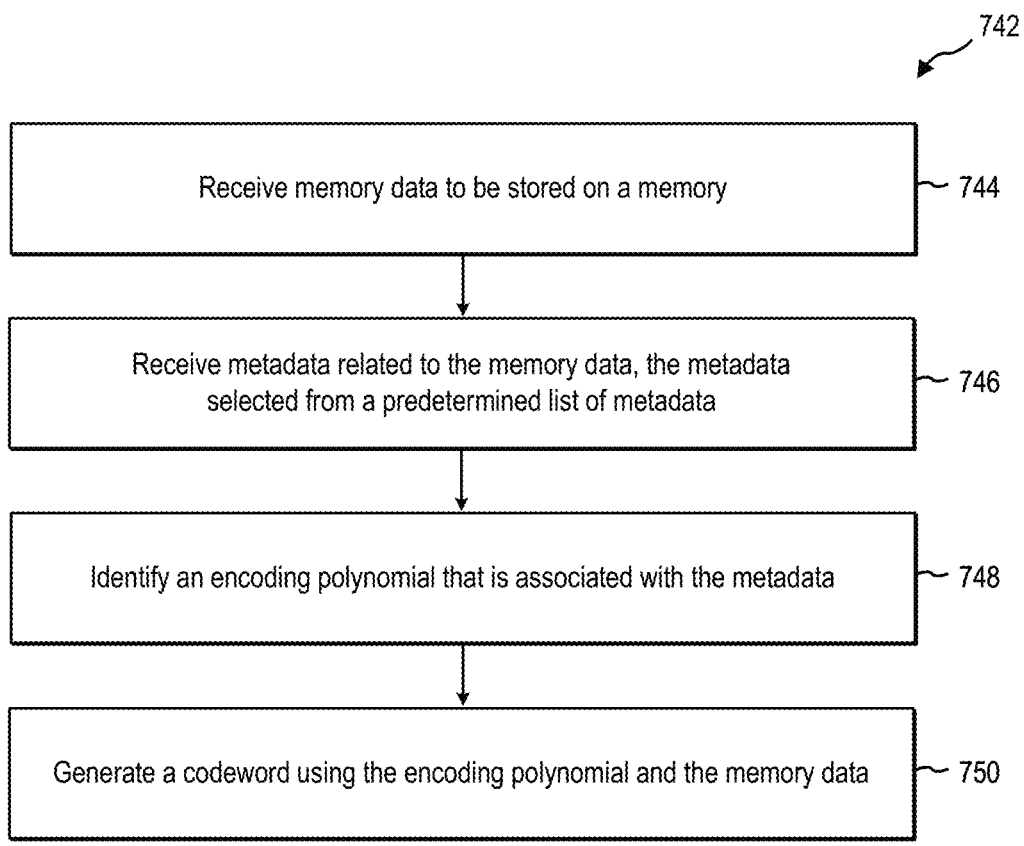
FIG. 7 is a flowchart of a method for encoding a codeword, according to at least one embodiment of the present disclosure.
Figure 8:
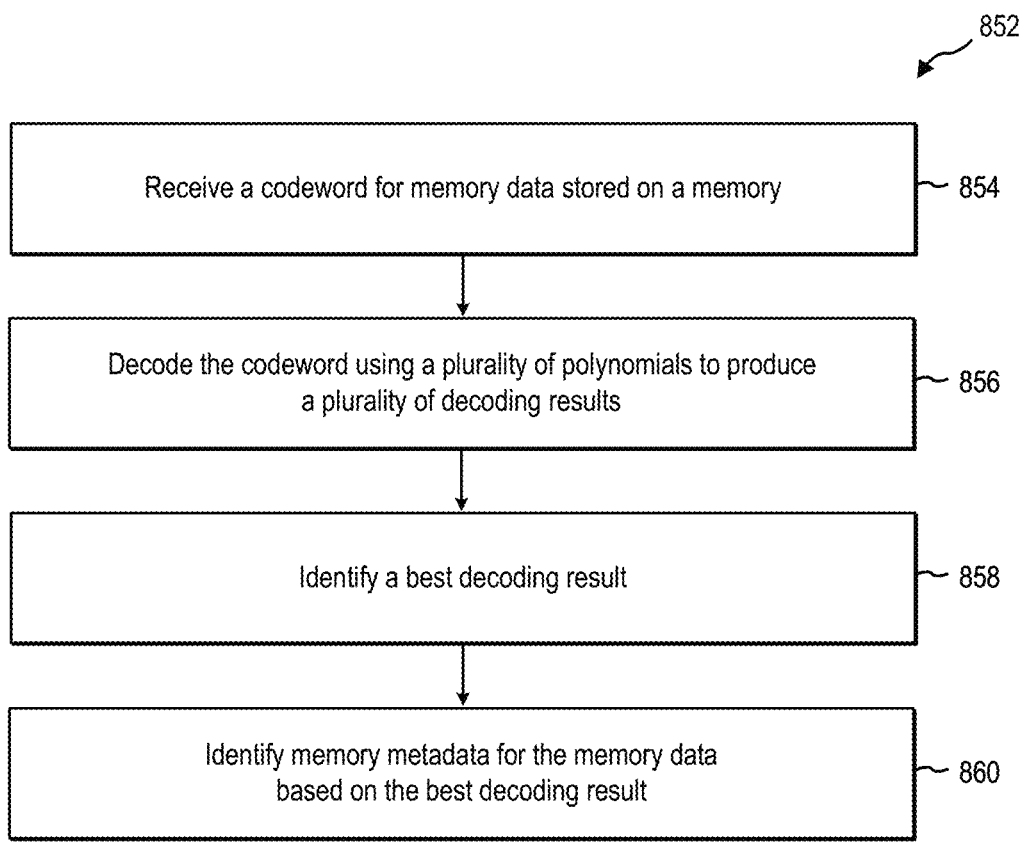
FIG. 8 is a flowchart of a method for decoding a codeword, according to at least one embodiment of the present disclosure.
Figure 9:
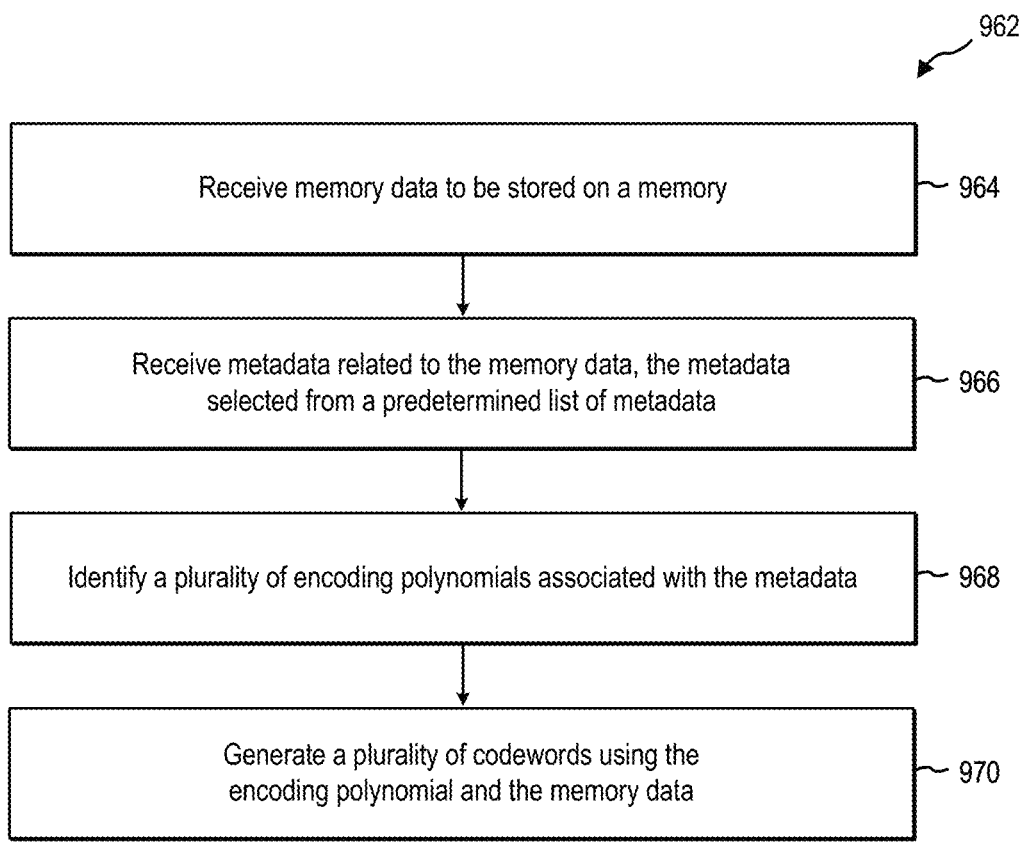
FIG. 9 is a flowchart of a method for encoding a plurality of codewords, according to at least one embodiment of the present disclosure.

FIGS. 7-9, the corresponding text, and the examples provide a number of different methods, systems, devices, and computer-readable media implemented by the memory encoding system 100 of FIG. 1. In addition to the foregoing, one or more embodiments can also be described in terms of flowcharts comprising acts for accomplishing a particular result. FIG. 7-9 may be performed with more or fewer acts. Further, the acts may be performed in differing orders. Additionally, the acts described herein may be repeated or performed in parallel with one another or parallel with different instances of the same or similar acts.

As mentioned, FIG. 7 illustrates a flowchart of a method 742 or series of acts for encoding data in memory in accordance with one or more embodiments. While FIG. 7 illustrates acts according to one embodiment, alternative embodiments may omit, add to, reorder, and/or modify any of the acts shown in FIG. 7. The acts of FIG. 7 can be performed as part of a method. Alternatively, a computer-readable medium can comprise instructions that, when executed by one or more processors, cause a computing device to perform the acts of FIG. 7. In some embodiments, a system can perform the acts of FIG. 7. In some embodiments, the acts of FIG. 7 may be implemented at a memory controller. For example, the acts of FIG. 7 may be implemented at the memory controller 104 of FIG. 1.

A memory controller may receive memory data to be stored on a memory device at 744. The memory data may include enough information to fill all the available storage space on the memory, or the memory data may include allocations of memory slots to fill all the available storage space on the memory. The memory controller may receive metadata related to the memory data at 746. The metadata may be selected from a predetermined list of metadata. The host that sends the memory data and the metadata may have and/or reference the predetermined list of metadata. The memory controller may also include the predetermined list of metadata.

Using the metadata, the memory controller may identify an encoding polynomial that is associated with the metadata. The encoding polynomial may be a part of a plurality of polynomials. The plurality of polynomials may be associated with the predetermined list of metadata. For example, each polynomial may be associated with a different metadata of the predetermined list of metadata. To identify the encoding polynomial, the memory controller may review the predetermined list of metadata for the received metadata and identify the polynomial that is associated with the received metadata at 748.

The memory controller may generate the ECC using the polynomial. In some embodiments, the memory controller may generate a codeword including the memory data and the ECC at 750. In some embodiments, the metadata may not be encoded in the codeword. In some embodiments, the metadata may not be stored on the memory. In some embodiments, the size of the metadata value may be based on a quantity of the plurality of polynomials.

In some embodiments, each of the polynomials of the plurality of polynomials may generate a decodably distinct codeword. For example, a decodably distinct codeword may be distinct from other codewords. In this manner, when the memory controller decodes the codeword using each of the polynomials, the decoded information may be distinct and direct or point to the polynomial used to encode it.

As mentioned, FIG. 8 illustrates a flowchart of a method 852 or series of acts for encoding data in memory in accordance with one or more embodiments. While FIG. 8 illustrates acts according to one embodiment, alternative embodiments may omit, add to, reorder, and/or modify any of the acts shown in FIG. 8. The acts of FIG. 8 can be performed as part of a method. Alternatively, a computer-readable medium can comprise instructions that, when executed by one or more processors, cause a computing device to perform the acts of FIG. 8. In some embodiments, a system can perform the acts of FIG. 8. In some embodiments, the acts of FIG. 8 may be implemented at a memory controller. For example, the acts of FIG. 8 may be implemented at the memory controller 104 of FIG. 1.

In some embodiments, a memory controller may receive a codeword for memory data stored on a memory at 854. The memory controller may decode the codeword using a plurality of polynomials at 856. Decoding the codeword using the plurality of polynomials may generate a plurality of decoding results. The memory controller may identify a best decoding result from the plurality of decoding results at 858. In some embodiments, the best decoding result may be the decoding result that indicates no error. In some embodiments, the best decoding result may be the decoding result that indicates correctable error when the other decoding results indicate uncorrectable error.

The memory controller may identify memory metadata for the memory data from the predetermined list of metadata associated with the memory data based on the decoding result at 860. In some embodiments, the memory metadata may not be encoded in the codeword. In some embodiments, the memory metadata may not be stored on the memory. In some embodiments, the associations between the metadata and the plurality of polynomials may be stored on the memory controller.

In some embodiments, receiving the codeword may include receiving a plurality of codewords. Each codeword of the plurality of codewords may be decoded by each polynomial of the plurality of polynomials. In some embodiments, identifying the best decoding result may include identifying a best decoding result for each codeword of the plurality of codewords. In some embodiments, each best decoding result may be associated with an integer of the memory metadata. In some embodiments, the same polynomial may decode each codeword received at the memory controller. For example, identifying the best decoding result may include identifying which polynomial decoded each codeword. The metadata may then be determined using the decoding polynomial.

As mentioned, FIG. 9 illustrates a flowchart of a method 962 or series of acts for encoding data in memory in accordance with one or more embodiments. While FIG. 9 illustrates acts according to one embodiment, alternative embodiments may omit, add to, reorder, and/or modify any of the acts shown in FIG. 9. The acts of FIG. 9 can be performed as part of a method. Alternatively, a computer-readable medium can comprise instructions that, when executed by one or more processors, cause a computing device to perform the acts of FIG. 9. In some embodiments, a system can perform the acts of FIG. 9. In some embodiments, the acts of FIG. 9 may be implemented at a memory controller. For example, the acts of FIG. 9 may be implemented at the memory controller 104 of FIG. 1.

A memory controller may receive memory data to be stored on a memory device at 964. The memory data may include enough information to fill all the available storage space on the memory, or the memory data may include allocations of memory slots to fill all the available storage space on the memory. The memory controller may receive metadata related to the memory data at 966. The metadata may be selected from a predetermined list of metadata. In some embodiments, the predetermined list of metadata may include a predetermined list of metadata sections. The metadata sections may be portions of the metadata that may be encoded into a codeword.

Using the metadata, the memory controller may identify a plurality of encoding polynomials that are associated with the metadata at 968. The encoding polynomials may be part of a plurality of polynomials. The plurality of polynomials may be associated with the predetermined list of metadata sections. For example, each polynomial may be associated with a different metadata section of the predetermined list of metadata sections. To identify the encoding polynomials, the memory controller may review the predetermined list of metadata sections for the appropriate portion of the metadata and identify the polynomial that is associated with that portion of the metadata. For example, the metadata may include multiple digits. The memory controller may separate the metadata into sections based on the digits and identify an encoding polynomial for each digit.

In some embodiments, the memory controller may generate a plurality of codewords using the encoding polynomials and the memory data at 970. The plurality of codewords may be encoded using the plurality of polynomials. In some embodiments, the plurality of codewords may be identified in a codeword order. The codeword order may be based on the digit location of the digits of the metadata and the identified metadata sections.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A method implemented at a memory controller, comprising:
   receiving memory data to be stored on a memory;
   receiving metadata related to the memory data, the metadata selected from a predetermined list of metadata, wherein the metadata includes multiple digits and is descriptive of the memory data;
   separating the metadata into metadata sections based on the digits;
   identifying an encoding polynomial of a plurality of polynomials that is associated with each digit of the metadata, each polynomial of the plurality of polynomials associated with a different metadata section from the predetermined list of metadata; and generating a codeword using the encoding polynomial of the plurality of polynomials and the memory data.

2. The method of claim 1, wherein the codeword does not include the metadata.

3. The method of claim 1, wherein the metadata is not stored on the memory.

4. The method of claim 1, wherein each of the plurality of polynomials generate a decodably distinct codeword.

5. The method of claim 1, wherein a size of the metadata is based on a quantity of the plurality of polynomials.

6. A method implemented at a memory controller, comprising:

the method of claim 1;

receiving a codeword for memory stored on a memory;

decoding the codeword using a plurality of polynomials to generate a plurality of decoding results, each polynomial of the plurality of polynomials associated with different metadata from a predetermined list of metadata;

identifying a best decoding result from the plurality of decoding results; and identifying memory metadata for the memory from the predetermined list of metadata associated with the memory based on the best decoding result.

7. The method of claim 6, wherein the memory metadata is not encoded in the codeword.

8. The method of claim 6, wherein the memory metadata is not stored on the memory.

9. The method of claim 6, wherein the predetermined list of metadata is stored on the memory controller.

10. The method of claim 6, wherein identifying the best decoding result includes identifying the best decoding result of the plurality of decoding results that indicates no error.

11. The method of claim 6, wherein identifying the best decoding result includes identifying the best decoding result of the plurality of decoding results that indicates correctable error when other decoding results of the plurality of decoding results indicate uncorrectable error.

12. The method of claim 6, wherein each decoding result of the plurality of decoding results is identifiably distinct using an associated polynomial of the plurality of polynomials.

13. The method of claim 6, wherein receiving the codeword includes receiving a plurality of codewords, each codeword of the plurality of codewords decoded by each polynomial of the plurality of polynomials.

14. The method of claim 13, wherein identifying the best decoding result includes identifying best decoding results associated with each codeword of the plurality of codewords.

15. The method of claim 13, wherein identifying the best decoding result includes identifying which polynomial of the plurality of polynomials decoded each codeword of the plurality of codewords.

16. The method of claim 1, further comprising:

identifying a second encoding polynomial from the plurality of polynomials that is associated with the metadata, the second encoding polynomial of the plurality of polynomials associated with a metadata section, the second encoding polynomial associated with an encoding metadata section, the encoding metadata section combinable with the encoding polynomial of the plurality of polynomials from the predetermined list of metadata to form the metadata; and generating a plurality of codewords using the encoding polynomial of the plurality of polynomials from the predetermined list of metadata and the second encoding polynomial and the memory.

17. The method of claim 16, wherein the plurality of codewords are identified in a codeword order.

18. The method of claim 17, wherein the metadata section is representative of digits of the metadata, and further comprising identifying a digit location for the encoding metadata section based on the codeword order.

19. The method of claim 16, wherein the metadata is not stored on the memory.

20. The method of claim 16, wherein the metadata is not encoded in any of the plurality of codewords.

21. The method of claim 1, wherein the metadata includes an indicator regarding one or more of: (a) whether the memory data is stored in multiple different sockets or (b) whether the memory data is directly attached.

22. The method of claim 21, wherein the metadata includes an indicator of whether the memory data is stored or is directly attached for one or more of: (a) security considerations, (b) poison identification, or (c) cache tag bits.

* * * * *